(12) United States Patent
Sato

(10) Patent No.: US 9,954,036 B2
(45) Date of Patent: Apr. 24, 2018

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/922,995

(22) Filed: Oct. 26, 2015

(65) Prior Publication Data

US 2016/0126295 A1    May 5, 2016

(30) Foreign Application Priority Data

Nov. 5, 2014    (JP) ................................ 2014-225297

(51) Int. Cl.
*H01L 29/20* (2006.01)
*H01L 27/32* (2006.01)

(52) U.S. Cl.
CPC ...... *H01L 27/3213* (2013.01); *H01L 27/3218* (2013.01)

(58) Field of Classification Search
CPC ............... H01L 27/322; H01L 27/3213; H01L 27/3218

USPC ............................................... 257/88, 89, 90
See application file for complete search history.

(56) References Cited

U.S. PATENT DOCUMENTS

| | | |
|---|---|---|
| 2013/0234917 A1 | 9/2013 | Lee |
| 2014/0071030 A1 | 3/2014 | Lee |
| 2015/0355492 A1* | 12/2015 | Chu Ke ............ G02F 1/134309 257/72 |

FOREIGN PATENT DOCUMENTS

JP    2014-056819 A    3/2014

* cited by examiner

*Primary Examiner* — Hung Vu

(74) *Attorney, Agent, or Firm* — Typha IP LLC

(57) ABSTRACT

A display device includes plural unit areas each of which includes low definition pixels as sub-pixels larger than a specified standard and high definition pixels as sub-pixels smaller than the specified standard and which are regularly arranged. The low definition pixels include a blue pixel and a red pixel, and the high definition pixels include a white pixel and a green pixel.

7 Claims, 16 Drawing Sheets

FIG.3
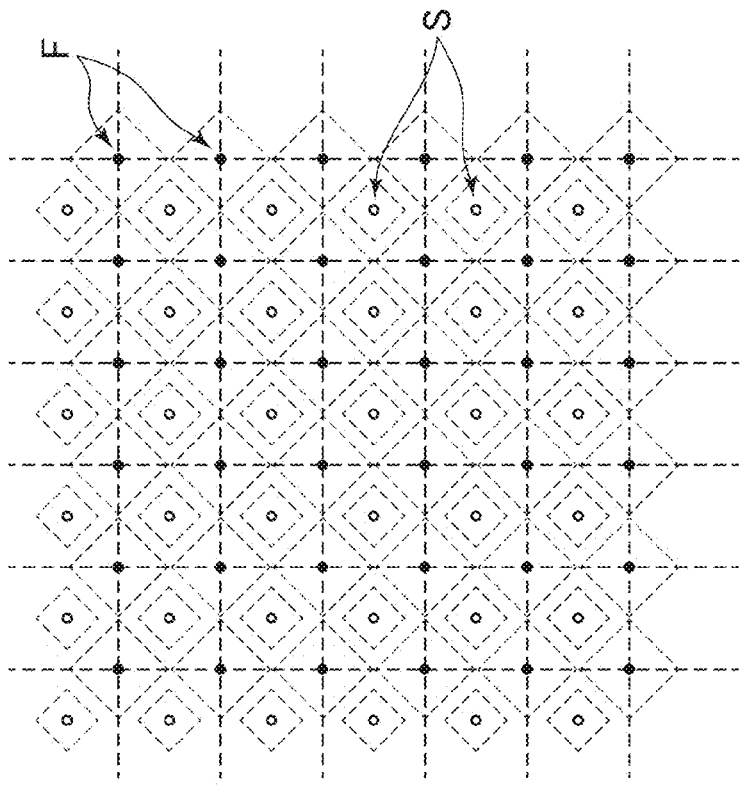
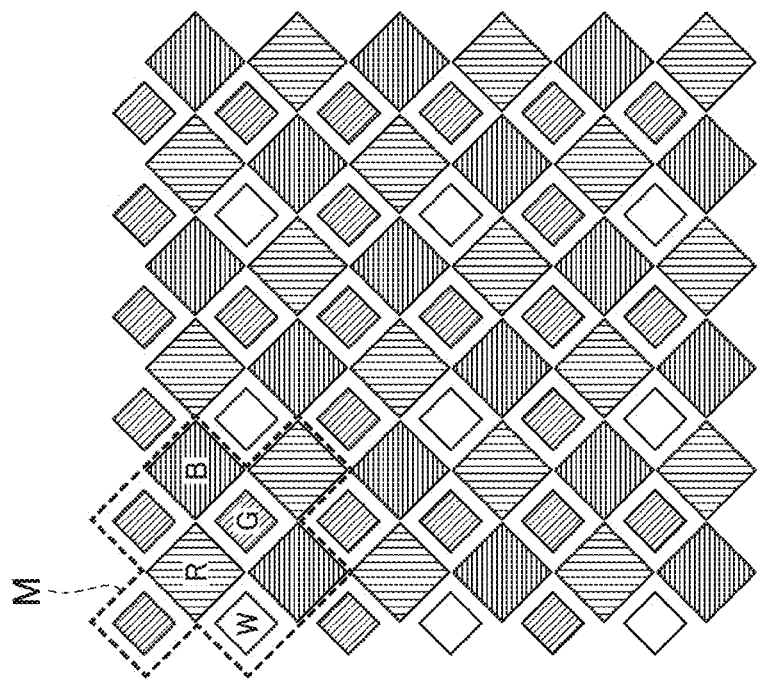

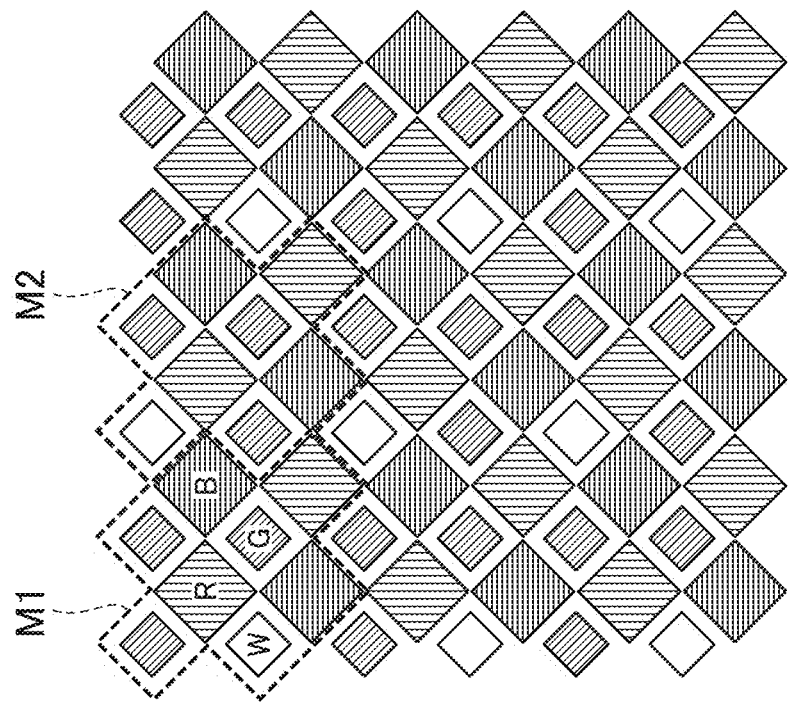
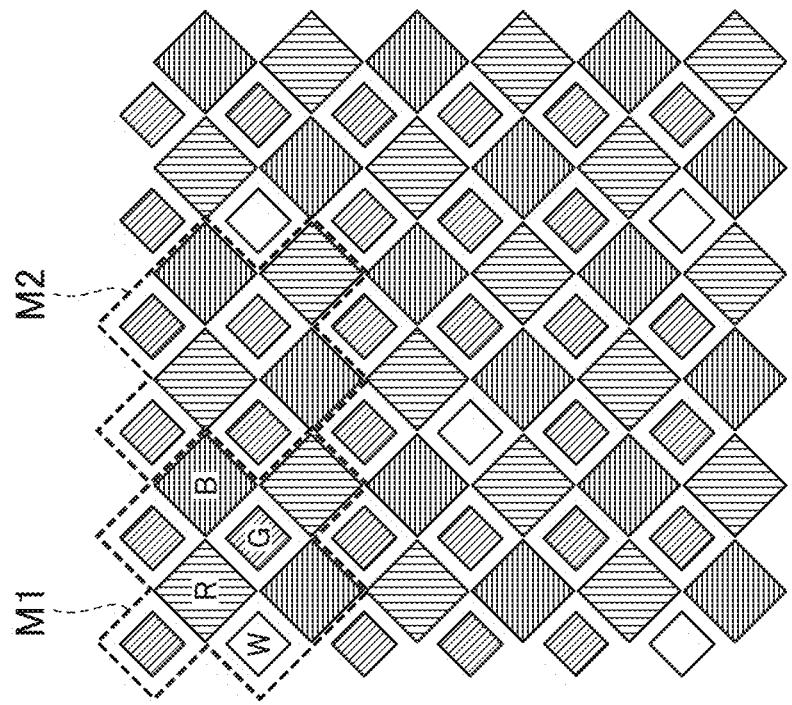
FIG.4

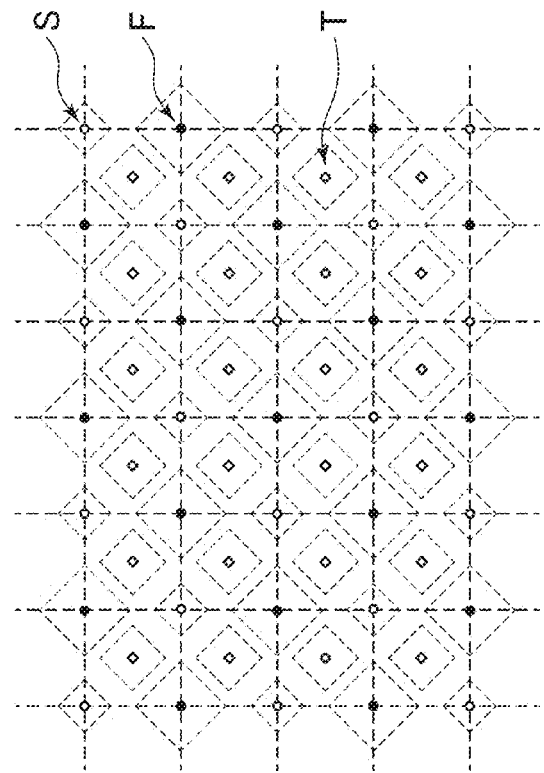
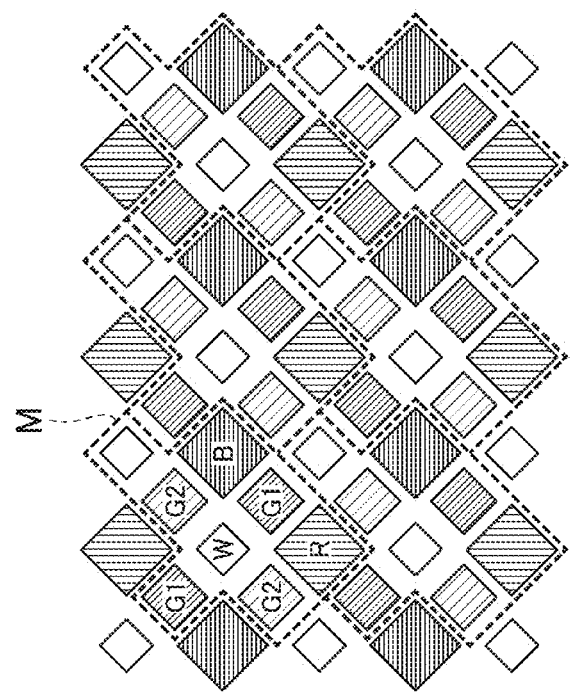
FIG.6

FIG.8
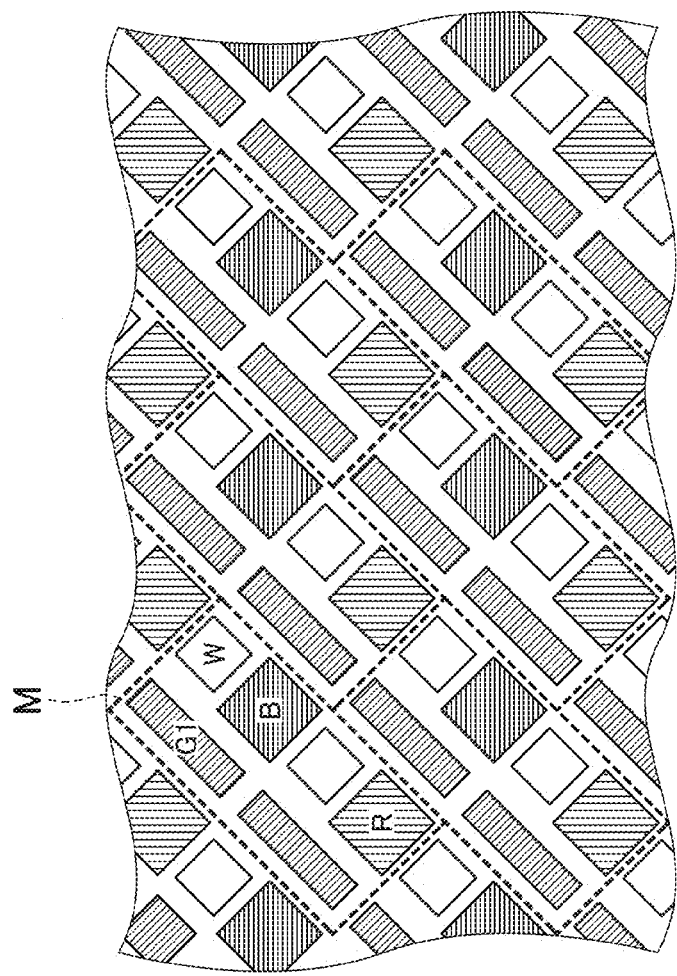
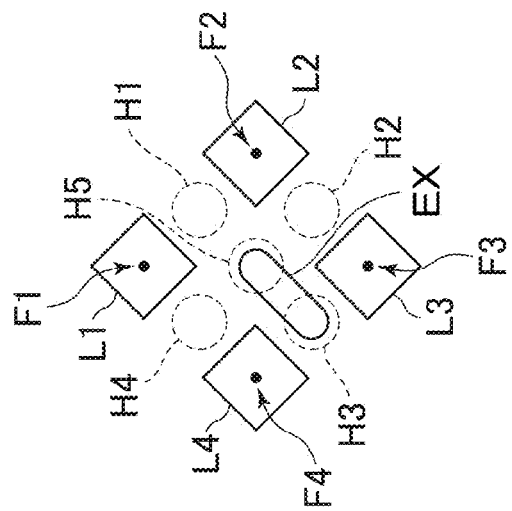

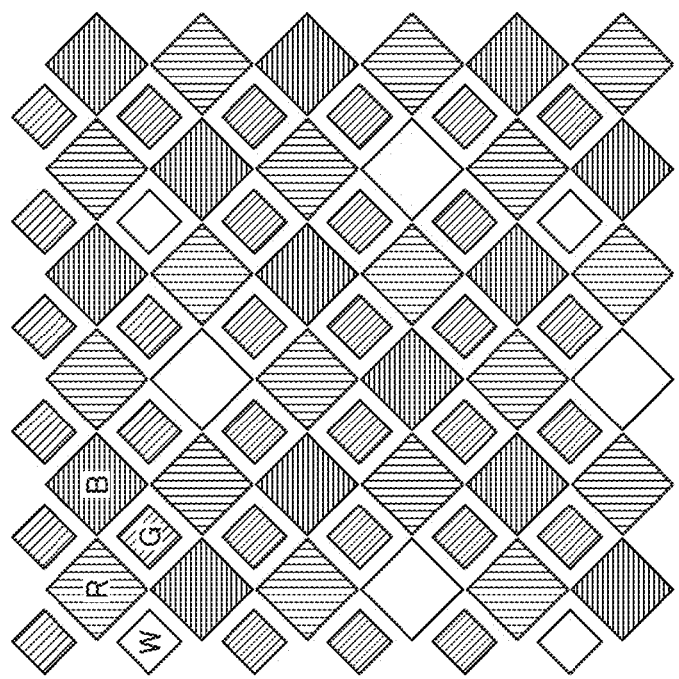
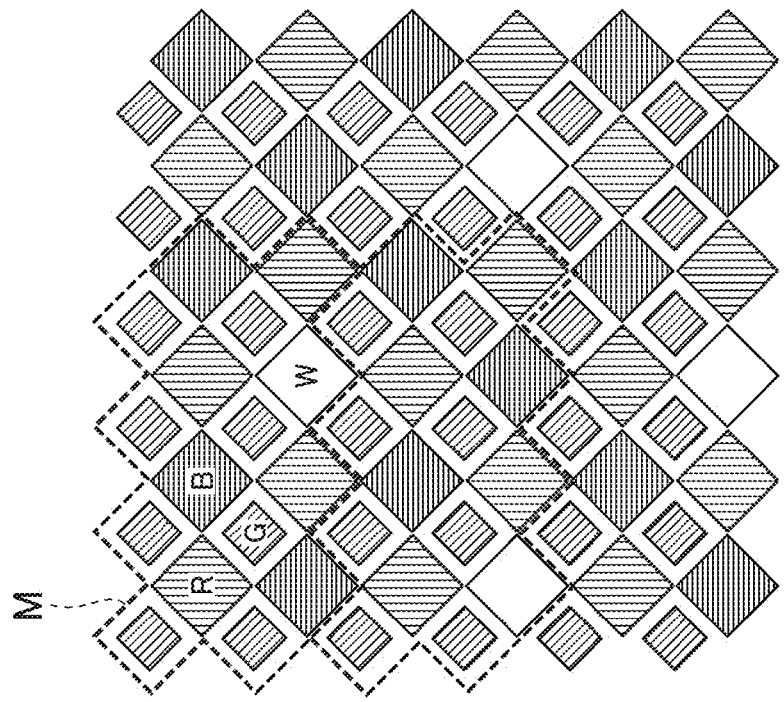
FIG.12

FIG.16

| P(1,1) | P(1,2) | P(1,3) | ••• | ••• | P(1,n) |
|--------|--------|--------|-----|-----|--------|
| P(2,1) | P(2,2) | P(2,3) |     |     |        |
| P(3,1) | P(3,2) | P(3,3) |     |     |        |
|   ⋮    |        |        |     |     |        |
|        |        |        |     |     |        |
| P(m,1) |        |        |     |     | P(m,n) |

DISPLAY DEVICE

CROSS-REFERENCE TO RELATED APPLICATION

The present application claims priority from Japanese application JP2014-225297 filed on Nov. 5, 2014, the content of which is hereby incorporated by reference into this application.

BACKGROUND OF THE INVENTION

1. Field of the Invention

The present invention relates to a display device.

2. Description of the Related Art

In a display device, in general, three-color sub-pixels of a red (R) pixel, a green (G) pixel and a blue (B) pixel having the same area are arranged side by side in a unit area corresponding to a main pixel, and these three kinds of sub-pixels are arranged in a stripe form in a display area where plural unit areas are regularly arranged.

Besides, there is also known an arrangement which is different from the general arrangement as stated above and in which one main pixel includes two colors of GR or GB and two kinds of sub-pixels are alternately spread. In each main pixel in this arrangement, for example, the area of a green pixel is ½ of the area of a blue pixel or a red pixel, and the number of sub-pixels decreases as compared with the general arrangement. However, almost comparable color reproducibility can be realized.

JP 2014-056819 A discloses a pixel arrangement structure of an organic light-emitting display device in which a pixel aperture ratio is improved and a gap between pixels is efficiently set.

Here, in order to reduce power consumption of a display device, it is conceivable to provide a white (W) pixel in a unit area in addition to RGB pixels.

However, there is a problem how to provide the white sub-pixel in a case where one unit area includes a green sub-pixel (high definition pixel) having a small area to improve definition and a red and a blue sub-pixel (low definition pixel) having a large area to reduce pixel integration degree in a display area.

SUMMARY OF THE INVENTION

The invention has an object to realize power consumption reduction by adopting a white pixel in at least one sub-pixel in a display device in which a unit area including a high definition pixel and a low definition pixel is arranged.

In view of the above, according to the invention, a display device includes plural unit areas each of which includes low definition pixels as sub-pixels larger than a specified standard and high definition pixels as sub-pixels smaller than the specified standard and which are regularly arranged. The low definition pixels include a blue pixel (B) and a red pixel (R), and the high definition pixels include a white pixel (W) and a green pixel (G).

BRIEF DESCRIPTION OF THE DRAWINGS

FIG. 3 is a view showing a pixel arrangement of the display device of the first embodiment.

FIG. 4 is a view showing a pixel arrangement of a display device of modified example 1 and modified example 2 of the first embodiment.

FIG. 6 is a view showing a pixel arrangement of a display device of a second embodiment.

FIG. 8 is a view showing a pixel arrangement of a display device of modified example 2 of the second embodiment.

FIG. 12 is a view showing a pixel arrangement of a display device of a fourth embodiment and a pixel arrangement of a display device of modified example 1 of the fourth embodiment.

FIG. 16 is a view for explaining a relation between a unit area M and an image address in the respective embodiments.

DETAILED DESCRIPTION OF THE INVENTION

Hereinafter, display devices according to respective embodiments of the invention will be described with reference to the drawings.

First Embodiment

Figure 1:
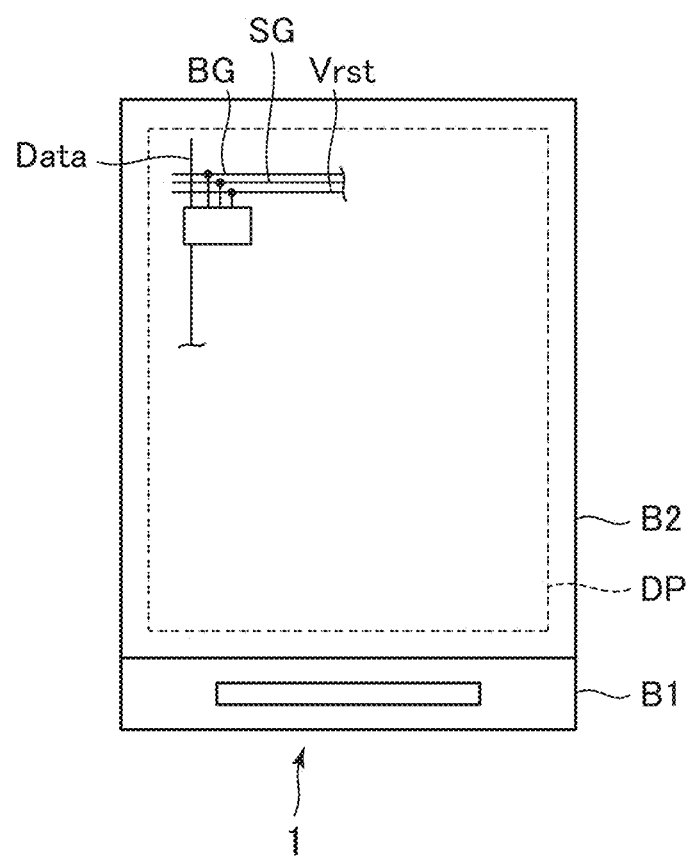
FIG. 1 is a plan view schematically showing a display device of a first embodiment.

A display device of a first embodiment is an organic EL display device in which plural organic electroluminescence elements are arranged in a display area. FIG. 1 is a schematic plan view of an organic EL display device 1 of the embodiment. The organic EL display device 1 is constructed such that an opposite substrate B2 is bonded to an element substrate B1 on which plural organic electroluminescence elements are arranged. A driver IC for driving the organic EL display device 1 is disposed in an area of the element substrate B1 where the opposite substrate B2 is exposed.

Plural pixels emitting lights of red, green, blue and white are regularly arranged as described later in a display area DP of the organic EL display device 1, and each of the pixels includes an organic electroluminescence element (self light-emitting element). As shown in FIG. 1, a first scanning line BG, a second scanning line SG, a reset wiring Vrst and a video signal line Data are connected to the respective pixels of the display area DP. The first scanning line BG, the second scanning line SG and the reset wiring Vrst are respectively provided in parallel to an X-direction, and the video signal line Data is provided in parallel to a Y-direction. Besides, although omitted in FIG. 1, plural power supply lines to supply power to the respective self light-emitting elements are provided in parallel to the Y-direction. Incidentally, the X-direction is a horizontal direction in which a short side of the element substrate B1 extends in FIG. 1, and the Y-direction is a vertical direction in which a long side of the element substrate 1 extends in FIG. 1.

Figure 2:
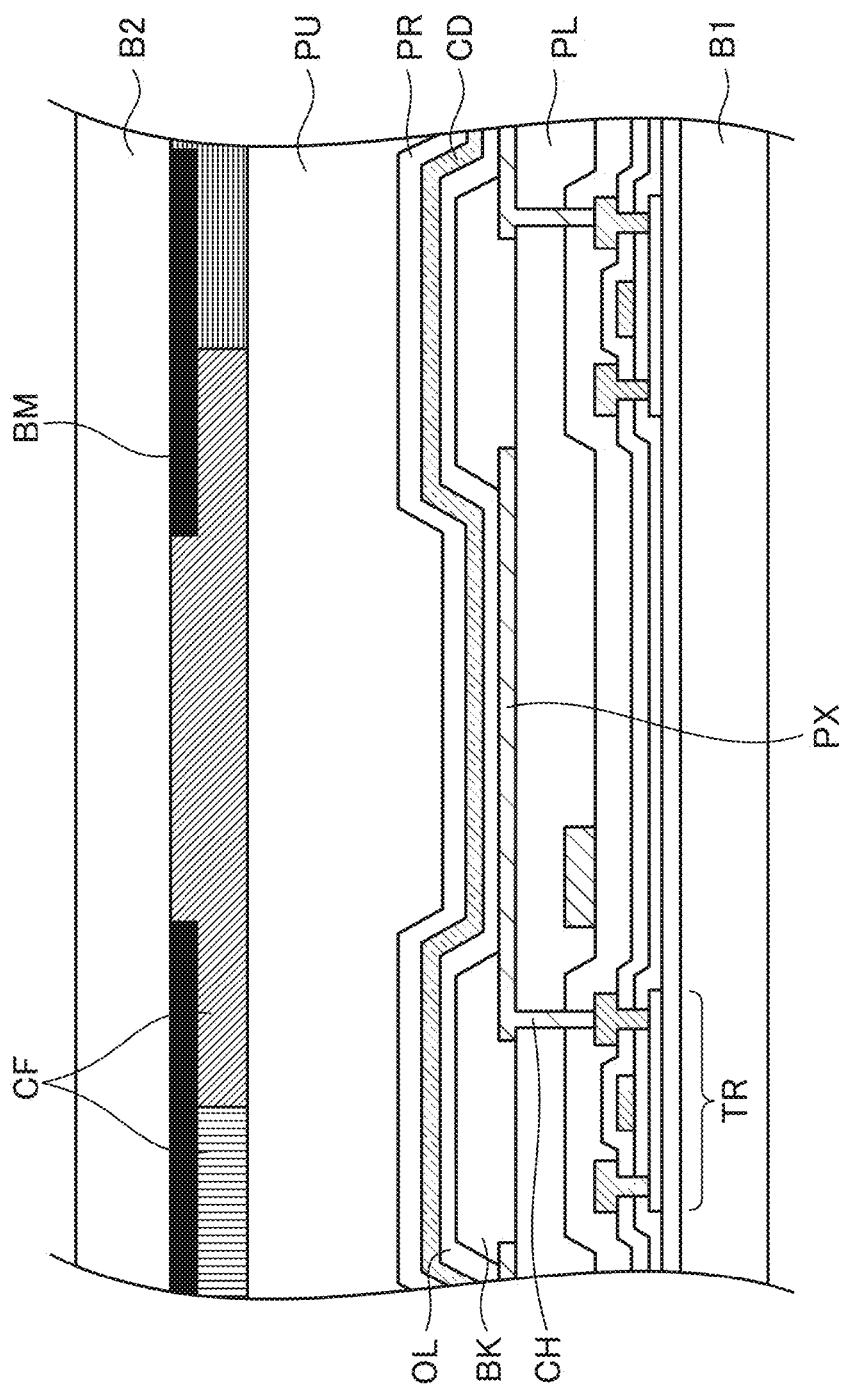
FIG. 2 is a sectional view of a pixel of the display device of the first embodiment.

FIG. 2 is a sectional schematic view of a pixel area in the organic EL display device 1 of the first embodiment. In the organic EL display device 1 of the first embodiment, an organic layer OL emitting white light is formed in common to the respective pixels over the whole surface of the display area DP, and the light emitted from the organic layer OL is colored in the opposite substrate B2 (color filter substrate) including an RGB color filter layer CF. Accordingly, the organic EL display device 1 of the embodiment is a self light-emitting display device of top emission type.

Besides, the organic layer OL is sandwiched between a lower electrode PX formed in each pixel and an upper electrode CD formed over the whole surface of the display area DP, and light is emitted by recombination of holes and electrons respectively injected from the lower electrode PX and the upper electrode CD.

Further, as shown in the drawing, the lower electrode PX of each pixel is formed on a flattening film PL formed of an organic insulating film to eliminate a step generated by a switching element, and the respective lower electrodes PX are separated by a bank layer BK for separating pixels. A black matrix BM formed on the opposite substrate B2 roughly corresponds to the bank layer BK, and partitions the respective color filter layers CF on the opposite substrate B2. A protecting layer PR for protecting the organic layer OL is formed above the upper electrode CD, and a filling material PU is inserted between the opposite substrate B2 and the element substrate B1. A transistor TR is arranged under the flattening film PL and on the substrate B1. Although not particularly restricted, the transistor TR includes a semiconductor region formed of polysilicon or the like, a gate insulating film formed on the semiconductor region, a gate electrode formed on the gate insulating film, a source electrode connected to the semiconductor region and formed of a conductive material such as metal in a contact hole of the gate insulating film, and a drain electrode connected to the semiconductor region and formed of a conductive material such as metal in a contact hole of the gate insulating film. A contact hole is formed in the flattening film PL above the drain electrode and the insulating film thereunder, and a contact CH is formed in the contact hole. The contact CH is connected to the lower electrode PX.

Here, FIG. 3 is a view showing a pixel layout of the display area DP in the organic EL display device 1 of the embodiment.

As shown on the left side of FIG. 3, a low definition pixel as a sub-pixel larger than a specified standard and a high definition pixel as a sub-pixel smaller than the specified standard are arranged in the display area DP of the embodiment. The low definition pixel is for reducing manufacturing load by decreasing the integration degree of pixels constituted of switching elements and the like. The high definition pixel is for improving the definition by compensating pixel roughness due to the low definition pixel. The low definition pixel and the high definition pixel are laid out in the display area DP, so that, as compared with a case of a general strip pixel arrangement, the number of sub-pixels is decreased, and comparable color reproducibility and smoothness of a video can be realized.

Besides, the specified standard for classifying the high definition pixel and the low definition pixel in the embodiment is an open area of the black matrix BM. The R pixel and the B pixel as the low definition pixel have a larger open area than the G pixel and the W pixel as the high definition pixel. The W pixel of the embodiment is color filterless, a portion between the black matrices is blank, and the W pixel emits light at a higher luminance than pixels of other colors. That is, in the display device of the embodiment, a signal processing system for coping with the introduction of the W pixel is adopted, a highly efficient light emission luminance adjustment function is realized, and the high luminance light emitting W pixel is in charge of the common white component formed by RGB pixels. Thus, the light emission of the RGB pixels can be reduced, and the power consumption can be reduced. As stated above, the W pixel is for suppressing the power consumption of the display device by securing the luminance. Thus, the W pixel is preferably made to belong to the high definition pixel, instead of making the W pixel belong to the low definition pixel larger than the specified standard. Besides, when the W pixel is made to belong to the high definition pixel, not the low definition pixel, a high saturation image becomes easy to be displayed.

Besides, as shown on the left side of FIG. 3, the low definition pixels are arranged in a matrix form at a first pitch in the horizontal direction and a second pitch in the vertical direction. The high definition pixels are arranged in a matrix form at the same pitch as that of the low definition pixel, and are shifted with respect to the low definition pixels by a distance smaller than the first pitch in the horizontal direction and by a distance smaller than the second pitch in the vertical direction. Specifically, as shown on the right side of FIG. 3, the pixel centers of the low definition pixels are arranged to overlap a first lattice point group including plural lattice points F (black dots) arranged in a rectangular lattice shape (specifically, square lattice shape). The pixel centers of the high definition pixels are arranged to overlap a second lattice point group including plural lattice points S (white dots) arranged in a rectangular lattice shape at positions shifted from the first lattice point group by a half pitch in the vertical direction and in the horizontal direction.

Besides, as shown on the left side of FIG. 3, the R pixel and the B pixel as the low definition pixel are alternately arranged in the vertical direction and in the horizontal direction. In the low definition pixels in the embodiment, an inter-pixel distance in the vertical direction or the horizontal direction is smaller than that in an oblique direction of 45 degrees, and the R pixel and the B pixel are alternately arranged in the vertical direction and the horizontal direction in which the inter-pixel distance of the low definition pixels becomes small. In other words, the R pixel and the B pixel are alternately arranged in the direction corresponding to the minimum inter-lattice point distance in the first lattice point group. This prevents the R pixels and the B pixel having large pixel areas from approaching each other and prevents light emission of the same color from becoming locally noticeable.

The high definition pixel is arranged to fill a space between two low definition pixels adjacent to each other in the oblique direction of 45 degrees in which the inter-lattice point distance of the low definition pixels is large. In the embodiment, as shown on the left side of FIG. 3, the high definition pixels are arranged so that the ratio of the number of the G pixels to the number of the W pixels is 3 to 1. The G pixels have higher contribution to definition recognition than the W pixels. The number of the G pixels is made larger than that of the W pixels, so that the definition can be improved. Besides, a unit area corresponding to a main pixel on the left side of FIG. 3 is defined as indicated by a broken line frame M, and the unit areas each constituted of the sub-pixels of the same arrangement are arranged in the vertical and horizontal directions. In each of the unit areas, the R pixels and the B pixels are more thinned than the G pixels, and the number of the G pixels is larger than the number of the R pixels and the number of the B pixels.

Besides, with respect to the opening area of the sub-pixel, that of the G pixel and the W pixel as the high definition pixel is smaller than that of the R pixel and the B pixel as the low definition pixel, and further, that of the W pixel is preferably smaller than that of the G pixel. In FIG. 3, each sub-pixel has a diamond shape in which a square is inclined by 45 degrees and is arranged. However, the invention is not limited to the form, and the opening portion of the pixel may have another shape. Incidentally, in FIG. 3, the W pixel has no hatching, the G pixel is indicated by hatching extending to the lower right, the B pixel is indicated by horizontal hatching, and the R pixel is indicated by vertical hatching.

Next, the left side of FIG. 4 is a view showing a pixel layout of the display area DP in modified example 1 of the first embodiment, and the right side of FIG. 4 is a view showing a pixel layout of the display area DP in modified example 2 of the first embodiment. In the modified example 1, the ratio of the number of G pixels to the number of W pixels is 7:1, and a unit area M1 as a main pixel including the W pixel and a unit area M2 as a main pixel not including the W pixel are alternately arranged. In other words, part of the plural G pixels existing in the unit area M2 is replaced by the W pixel in the unit area M1, and hereby, the picture quality is improved as compared with the example of FIG. 3.

In the modified example 2, the ratio of the number of G pixels to the number of W pixels is 3:1, and the arrangement positions of the W pixels in a unit area M1 and a unit area M2 adjacent to each other are different from each other. Hereby, the picture quality is improved as compared with the left side of FIG. 4. Besides, in another viewpoint, high definition pixel columns in which the W pixels are arranged exist at an interval of one column, and the arrangements of the W pixels are shifted in the vertical direction in two high definition pixel columns including the W pixels and adjacent to each other.

Figure 5:
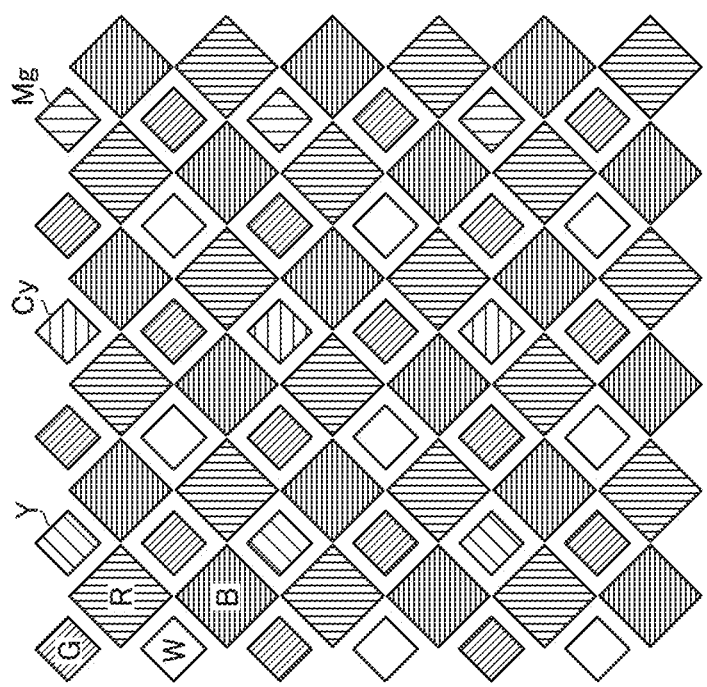
FIG. 5 is a view showing a pixel arrangement of a display device of modified example 3 of the first embodiment.

FIG. 5 is a view showing a pixel layout of the display area DP in modified example 3 of the first embodiment. As shown in the drawing, in the modified example 3, high definition pixels include a cyan (Cy) pixel, a magenta pixel (Mg) pixel and a yellow pixel in addition to a G pixel and a W pixel. High definition pixel columns in which the Cy pixels, the Mg pixels and the Y pixels are arranged exist at an interval of one column. In one column, one of the Cy pixel, the Mg pixel and the Y pixel and the G pixel are alternately arranged. A high definition pixel column in which the G pixel and the W pixel are alternately arranged exists between high definition pixel columns in which the Cy pixels, the Mg pixels and the Y pixels are respectively arranged. Besides, the Cy, Mg and Y pixels and the W pixel are arranged in different rows and are prevented from being adjacent to each other, so that the picture quality is improved. (In other words, in the vertical and horizontal directions in the second lattice point group corresponding to the high definition pixel arrangement, the G pixel and W pixel are adjacent to each other, the G pixel and the Cy, Mg and Y pixels are adjacent to each other, and the W pixel is not adjacent to the Cy, Mg and Y pixels at the minimum inter-lattice point distance in the second lattice point group.) Incidentally, in FIG. 5, the Y pixel is indicated by oblique hatching extending to the lower left. The Cy pixel is indicated by horizontal hatching and the hatching interval thereof is larger than that of the B pixel. The Mg pixel is indicated by vertical hatching and the hatching interval thereof is larger than that of the R pixel.

Second Embodiment

Next, a second embodiment of the invention will be described. FIG. 6 is a view showing a pixel layout of a display area DP in an organic EL display device 1 of the second embodiment.

As shown on the left side of FIG. 6, in the pixel layout of the second embodiment, although the density of low definition pixels is lower than that of the case of the first embodiment, the number of high definition pixels is increased, and a smoother image display is realized.

In the second embodiment, as shown on the right side of FIG. 6, pixel centers of low definition pixels corresponding to R pixels and B pixels are arranged so as to overlap a first lattice point group including plural lattice points F (black dots) arranged in an oblique lattice shape, and high definition pixels are arranged around the low definition pixel. As shown also on the left side of FIG. 6, the high definition pixels are arranged in the vertical direction, in the horizontal direction and in the oblique direction of 45 degrees with respect to the low definition pixel. In the pixel arrangement of the second embodiment, eight high definition pixels are arranged around one low definition pixel.

The R pixels and the B pixels included in the low definition pixels are alternately arranged at plural lattice points lined up at a minimum inter-lattice point distance in the first lattice point group (that is, since the first lattice point group has an oblique lattice-shaped arrangement, the pixels are alternately arranged in the oblique direction of 45 degrees). This prevents light-emission colors of the low definition pixels from collectively recognized. Besides, as shown on the left side of FIG. 6, G pixels (including G1 pixels and G2 pixels described later) are more arranged than W pixels, and the ratio of the G pixels to the W pixels is 3:1. The G pixel is arranged between the R pixel and the B pixel alternately arranged in the oblique direction. The W pixel is arranged at the center position of four lattice points constituting one unit of the oblique lattice in the first lattice point group.

The pixel centers of the high definition pixels are arranged to overlap a second lattice point group constituted of plural lattice points S (white dots) arranged in an oblique lattice shape shifted by a half pitch in the vertical direction or the horizontal direction with respect to the first lattice point group, and a third lattice point group constituted of plural lattice points T (rhombus) arranged in a rectangular lattice shape in which a pitch in the vertical direction and the horizontal direction is almost half that of the first lattice point group (see the right side of FIG. 6). Incidentally, the pixel centers of the high definition pixels may not be necessarily arranged in the second lattice point group and the third lattice point group. For example, the pixel centers of the high definition pixels may be arranged on a lattice point group shifted by ⅓ pitch in the vertical and horizontal directions with respect to the first lattice point group, and the arrangement of the high definition pixels is not limited to the arrangement of the embodiment.

Besides, in the second embodiment, the inter-pixel distance between the W pixel and the R or B pixel is larger than the inter-pixel distance between the G pixel and the R or B pixel. The influence of the W pixel on the R pixel or the B pixel with low visibility is reduced, and the picture quality is improved.

With respect to the opening area of the sub-pixel, that of the G pixel and the W pixel as the high definition pixel is smaller than that of the R pixel and the B pixel as the low definition pixel, and further, that of the W pixel is preferably smaller than that of the G pixel. In FIG. 3, although each sub-pixel has a diamond shape in which the square is inclined in the direction of 45 degrees and is arranged, the invention is not limited to the form, and the opening portion of the pixel may have another shape.

Especially, in the organic EL display device 1 of the second embodiment, the G pixels correspond to two kinds of pixels, that is, the G1 pixel and the G2 pixel. A color filter layer CF for obtaining dense green light is formed for the former pixel, and a color filter layer for obtaining pale green light is formed for the latter pixel. Since the two kinds of G pixels are included in the unit area, a smooth display is obtained.

Incidentally, in the G1 pixel and the G2 pixel, it is also acceptable that the color filter layers CF for obtaining the same green are formed, the G1 pixel is made to emit dark green light by signal processing, and the G2 pixel is made to emit bright green light by signal processing. For example, it is also acceptable that the G1 pixel emits light with a luminance value in a first range, the G2 pixel emits light with a luminance value in a second range, and the center value of the first range is lower than the center value of the second range. The G1 pixel and the G2 pixel are alternately arranged, so that a smooth display is obtained. Incidentally in FIG. 6, the G1 pixel is indicated by oblique hatching extending to the lower right, and the G2 pixel is indicated by oblique hatching extending to the lower right and the hatching interval thereof is wider than that of the G1 pixel.

Figure 7:
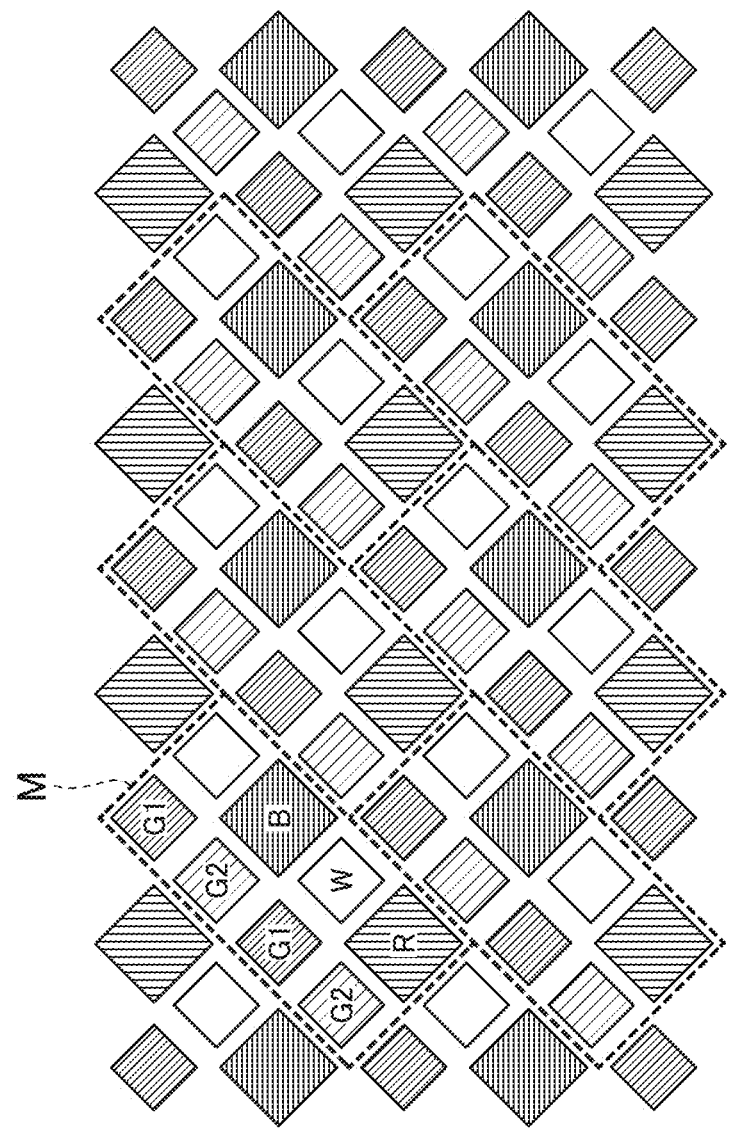
FIG. 7 is a view showing a pixel arrangement of a display device of modified example 1 of the second embodiment.

FIG. 7 is a view showing a pixel arrangement of an organic EL display device 1 of modified example 1 of the second embodiment. As shown in the drawing, in the display area DP of the modified example 1, G pixels corresponds to two kinds of pixels, that is, a G1 pixel and a G2 pixel. A color filter layer CF for obtaining dark green light is formed for the former pixel, and a color filter layer CF for obtaining pale green light is formed for the latter pixel. The modified example 1 is different from the case of FIG. 6 in that the G1 pixels and the G2 pixels form a line in an oblique direction of 45 degrees and are continuously arranged (continuously arranged at half of a pitch of the low definition pixels in the oblique direction). Since the G1 pixel and the G2 pixel are close to each other and are arranged without another color pixel sandwiched therebetween, a color filter substrate can be easily formed.

FIG. 8 is a view showing a pixel arrangement of an organic EL display device 1 of modified example 2 of the second embodiment. As shown on the left side of FIG. 8, the modified example is different from the case of FIG. 7 in that a G pixel of a display area DP of the modified example 2 is formed as an extending pixel which extends in a specified direction and has a size larger than a low definition pixel.

The extending pixel of the modified example has such a shape that the two pixels (G pixel and G2 pixel) of FIG. 7 are connected, and room can be provided for the arrangement of a pixel circuit as compared with the case of FIG. 6 or FIG. 7.

Here, the extending pixel will be described in more detail by using the right side of FIG. 8. A first lattice point F1, a second lattice point F2, a third lattice point F3 and a fourth lattice point F4 shown on the right side of FIG. 8 indicate four lattice points arranged in the circumferential direction of the square as the minimum lattice unit in the first lattice point group arranged in the oblique lattice shape. A first low definition pixel L1 is arranged at the first lattice point F1, a second low definition pixel L2 is arranged at the second lattice point F2, a third low definition pixel L3 is arranged at the third lattice point F3, and a fourth low definition pixel L4 is arranged at the fourth lattice point F4. A first high definition area H1 is arranged between the first low definition pixel L1 and the second low definition pixel L2, a second high definition area H2 is arranged between the second low definition pixel L2 and the third low definition pixel L3, a third high definition area H3 is arranged between the third low definition pixel L3 and the fourth low definition pixel L4, and a fourth high definition area H4 is arranged between the fourth low definition pixel L4 and the first low definition pixel L1.

Besides, a fifth high definition area H5 is arranged at an intersection point (center position of the square as the minimum lattice unit) between a straight line connecting the first lattice point F1 and the third lattice point F3 and a straight line connecting the second lattice point F2 and the fourth lattice point F4. Each extending pixel EX is formed to straddle the fifth high definition area H5 and one of the first to the fourth high definition areas H1 to H4.

In another viewpoint, the extending pixel EX of the modified example extends to include the middle point on one side of the square constituting the minimum lattice unit in the first lattice point group and the intersection point between the diagonal lines of the square, and extends so as to overlap one lattice point S belonging to the second lattice point group and one lattice point T adjacent to the lattice point S and belonging to the third lattice point group.

Incidentally, the shape of the extending pixel EX may not be necessarily the rectangular shape, and may have an elliptical shape or another shape. However, at least the opening area thereof is made smaller than that of the low definition pixel.

Figure 9:
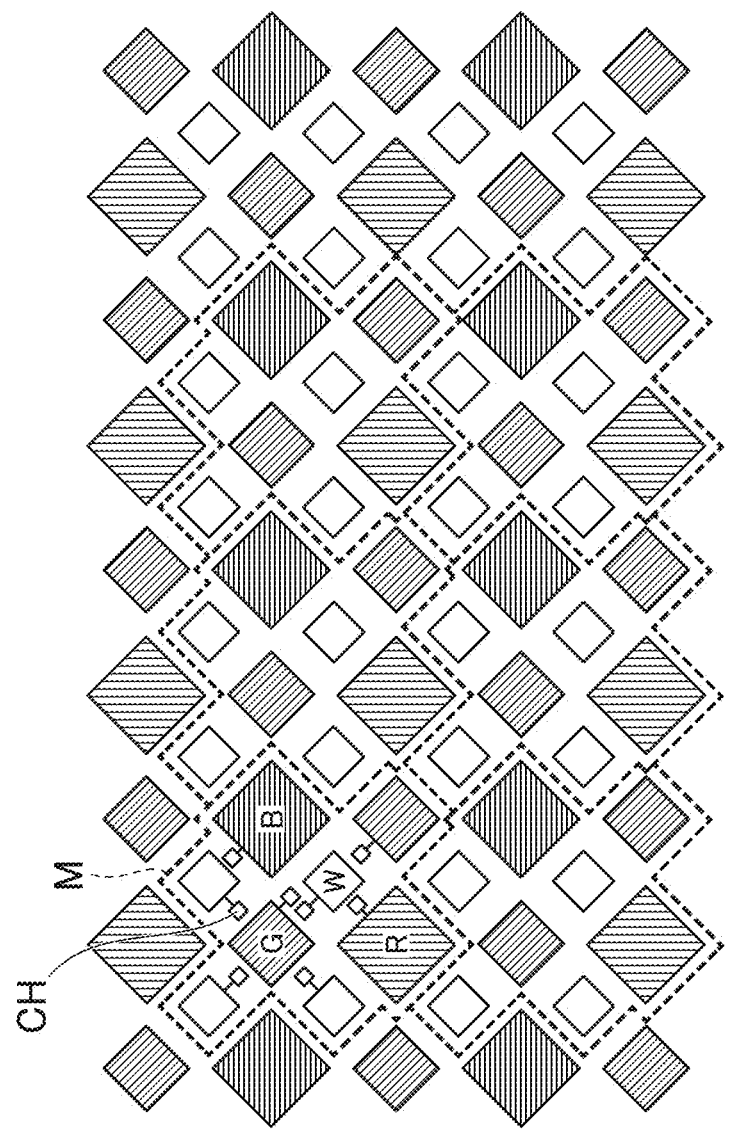
FIG. 9 is a view showing a pixel arrangement of a display device of modified example 3 of the second embodiment.

FIG. 9 is a view showing a pixel arrangement of an organic EL display device 1 in modified example 3 of the second embodiment. As shown in the drawing, the organic EL display device 1 of the modified example 3 is different from that of the case of FIG. 7 in the arrangement of W pixels and G pixels and in that the opening area of the W pixel is smaller than that of the G pixel.

Specifically, the pixel centers of the W pixels are arranged to correspond to the rectangular lattice-shaped third lattice point group to which the plural lattice points T belong, and the pixel centers of the G pixels are arranged to correspond to the oblique lattice-shaped second lattice point group to which the plural lattice points S belong. Besides, although the number of the W pixels is larger than the number of the G pixels in a unit area M corresponding to a main pixel, the opening area of the W pixel is made smaller than that of the G pixel to keep balance, so that the G pixel having high contribution to definition recognition is made noticeable.

As stated above, the number of the W pixels each having the opening area smaller than that of the G pixel is made larger than the number of the G pixels, so that a space for forming a contact CH and the like is easily secured, and manufacturing load can be reduced. Besides, the four W pixels in the unit area M may be controlled to have the same luminance. In this case, a signal may be branched and supplied to the four W pixels from the same video signal line Data, or a signal may be supplied from one video signal line Data to a pixel electrode PX formed to extend over four W pixels in the unit area M. Besides, a pixel electrode PX is formed to include at least two lattice points T belonging to the third lattice point group, and a signal may be supplied from one video signal line Data to the pixel electrode PX including the two lattice points T. Incidentally, the contact CH is arranged between the opening of the W pixel and the opening of the G pixel with respect to the W pixel, is arranged between the opening of the W pixel and the opening of the G pixel with respect to the G pixel, is arranged between the opening of the W pixel and the opening of the B pixel with respect to the B pixel, and is arranged between the opening of the W pixel and the opening of the R pixel with respect to the R pixel. With respect to the G pixel, the B pixel and the R pixel, the contact CH is provided between one of them and the W pixel having the smallest opening. With respect to the W pixel, since the W pixel having the smallest opening does not exist adjacently, the contact CH is provided between the W pixel and the G pixel. By doing so, while the respective pixels are made adjacent to each other, the contact CH can be provided.

Figure 10:
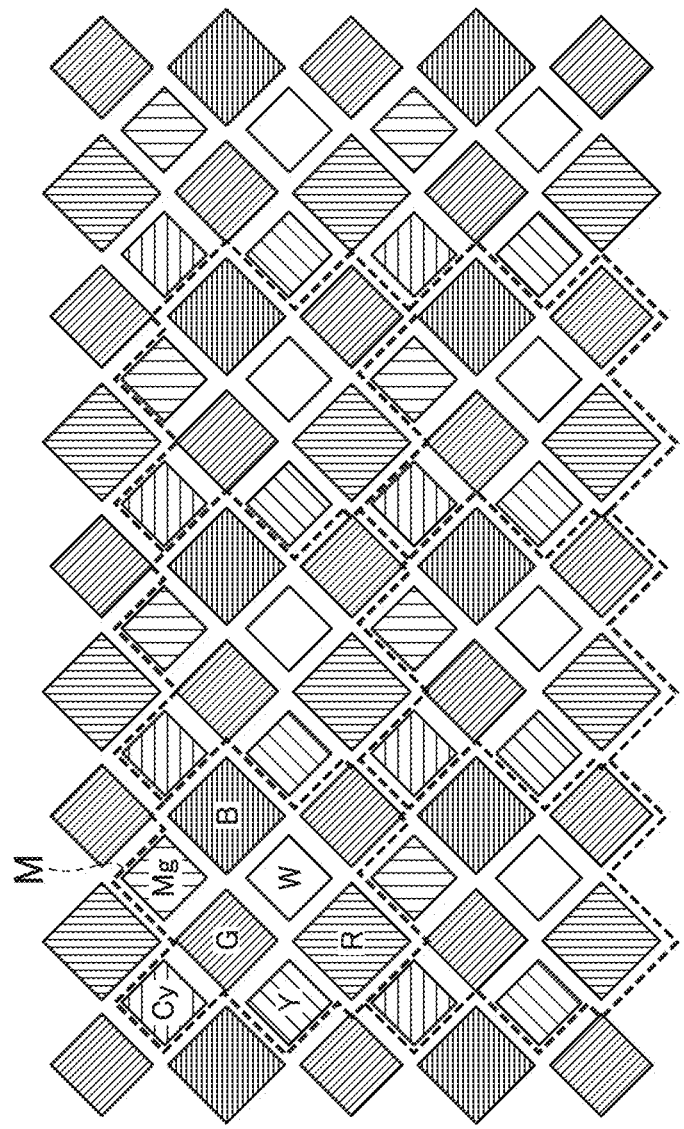
FIG. 10 is a view showing a pixel arrangement of a display device of modified example 4 of the second embodiment.

FIG. 10 is a view showing a pixel arrangement of an organic EL display device 1 of modified example 4 of the second embodiment. As shown in the drawing, in the modified example 4, high definition pixels include a cyan (Cy) pixel, a magenta (Mg) pixel and a yellow (Y) pixel in addition to a G pixel and a W pixel. Specifically, the Cy, Mg and W pixels are arranged at the lattice points T corresponding to the third lattice point group, and the G pixel is arranged at the lattice point S corresponding to the second lattice point group. As stated above, since the Cy, Mg and Y pixels are included in the high definition pixels, the organic EL display device 1 of higher image quality can be realized. Besides, the opening areas of the high definition pixels may be changed based on colored colors.

Although the organic EL display device 1 of the second embodiment and the modified examples thereof are described in the above, the description is made mainly on the different points from the organic EL display device 1 of the first embodiment, and the description of almost the same point as that of the case of the first embodiment is suitably omitted.

Third Embodiment

Figure 11:
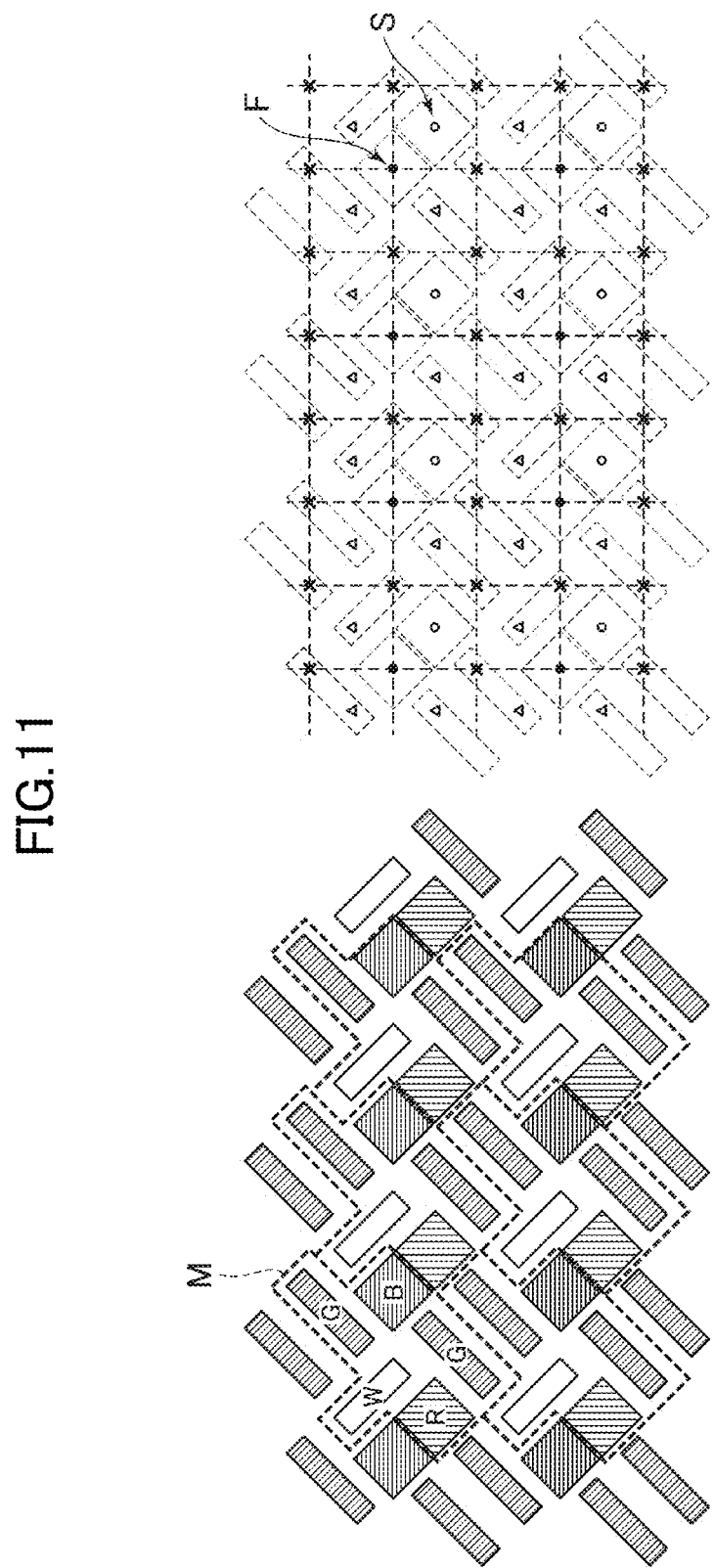
FIG. 11 is a view showing a pixel arrangement of a display device of a third embodiment.

Next, a third embodiment of the invention will be described. FIG. 11 is a view showing a pixel layout of a display area DP in an organic EL display device 1 of the third embodiment.

As shown on the left side of FIG. 11, in the organic EL display device 1 of the third embodiment, a pair of R pixel and B pixel are arranged to be adjacent to each other so that a high definition pixel does not exist therebetween, and high definition pixels each having a size larger in a specified direction than a low definition pixel are arranged around them. Since the pair of low definition pixels are arranged to be close to each other, many extending pixels are easily arranged as compared with the case of the modified example 2 (FIG. 8) of the second embodiment, and more room can be provided for the arrangement of a pixel circuit.

Here, the extending pixel will be described in more detail by using the right side of FIG. 11. In the display area DP of the embodiment, first, pixel centers of the B pixels are arranged to overlap a first lattice point group in which plural lattice points F are arranged in a rectangular lattice shape. The R pixels are arranged to be adjacent to the respective B pixels in an oblique direction of 45 degrees (diagonal direction of the square constituting the minimum lattice unit in the first lattice point group). The R pixel is arranged based on a lattice point S (white dot) shifted by ¼ pitch in the vertical direction and ¼ pitch in the horizontal direction with respect to the lattice point F (black dot) belonging to the first lattice point group.

The high definition pixels arranged to fill the surroundings of the pair of B pixel and R pixel are the extending pixels each having the size longer than that of the low definition pixel in the diagonal direction of the square constituting the minimum lattice unit in the first lattice point group. In other words, the extending pixel in the embodiment extends in the diagonal direction of the square of the minimum lattice unit in the first lattice point group from one of a point (X) shifted by ½ pitch in the vertical direction from the lattice point F, a point (X) shifted by ½ pitch in the horizontal direction and a point (X) shifted by ½ pitch in the vertical direction and in the horizontal direction, and reaches a point (triangle) shifted by ¼ pitch in the vertical direction and in the horizontal direction with respect to the one of these points.

Incidentally, the shape of the extending pixel may not be necessarily a rectangular shape, and may have an elliptical shape or another shape. However, at least the opening area thereof is made smaller than that of the low definition pixel.

Although the organic EL display device 1 of the third embodiment is described in the above, the description is made mainly on the different points from the organic EL display device 1 of the second embodiment, and the description of almost the same point as that of the case of the second embodiment is suitably omitted.

Fourth Embodiment

Next, a fourth embodiment of the invention will be described. FIG. 12 is a view showing a pixel layout of a display area DP in an organic EL display device 1 of the fourth embodiment.

As shown on the left side of FIG. 12, in the organic EL display device 1 of the fourth embodiment, low definition pixels include a W pixel, R pixels and B pixels are more thinned than G pixels, and part of the B pixels are replaced by the W pixels. In the low definition pixels of each unit area M, the ratio of the R pixel, the B pixel and the W pixel is 4:3:1. Besides, the positions of the W pixels are arranged to become the same in the unit areas M adjacent to each other in the horizontal direction, and the positions of the W pixels are arranged to become alternate in the unit areas M adjacent to each other in the vertical direction.

Since part of the B pixels as the low definition pixels are replaced by the W pixels, the white color is assigned to the blue color having low visibility, and a bad influence on the resolution can be reduced.

The right side of FIG. 12 is a view showing a pixel layout of a display area DP of an organic EL display device 1 of modified example 1 of the fourth embodiment. As shown on the right side of FIG. 12, the display area DP of the modified example 1 is different from the case of the left side of FIG. 12 in that part of B pixels of the low definition pixels are replaced by W pixels, and further, the W pixels are included also in the high definition pixels. Incidentally, on the left side and the right side of FIG. 12, although each sub-pixel has a diamond shape in which a square is inclined in a direction of 45 degrees and is arranged, the invention is not limited to the form, and the opening portion of the pixel may have another shape.

Although the organic EL display device 1 of the fourth embodiment is described in the above, the description is made mainly on the different points from the organic EL display device 1 of the first embodiment, and the description of almost the same point as that of the case of the first embodiment is suitably omitted.

Fifth Embodiment

Figure 13:
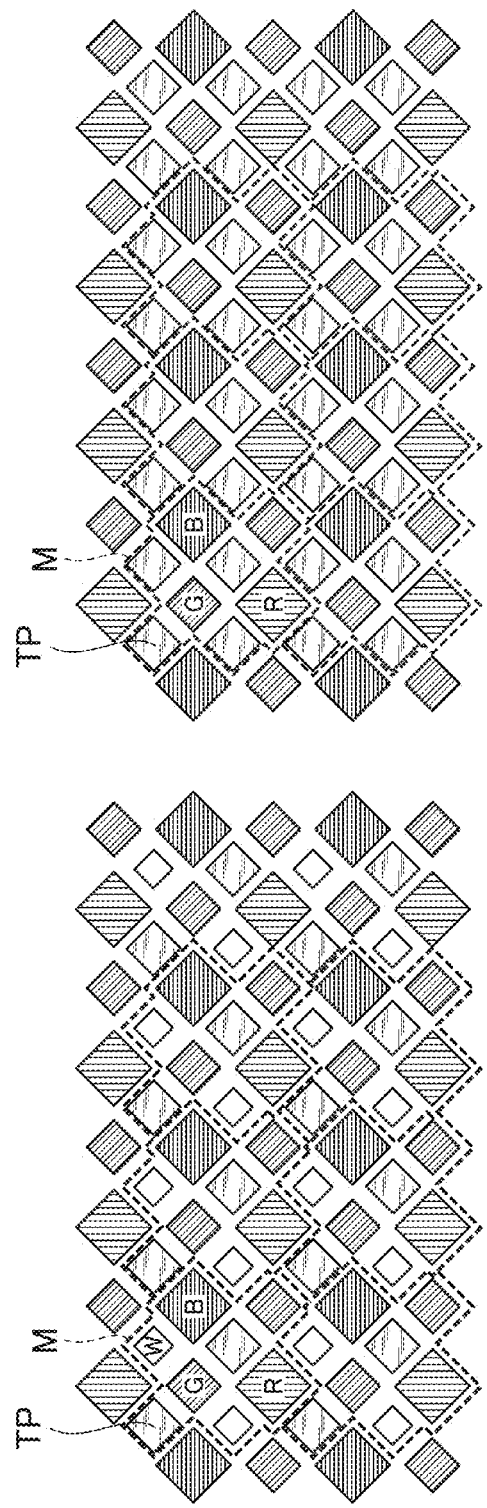
FIG. 13 is a view showing a pixel arrangement of a display device of a fifth embodiment and a pixel arrangement of a display device of modified example 1 of the fifth embodiment.

A fifth embodiment of the invention will be described. FIG. 13 is a view showing a pixel layout of a display area DP in an organic EL display device 1 of the fifth embodiment.

As shown on the left side of FIG. 13, the organic EL display device 1 of the fifth embodiment includes a transparent pixel TP, in addition to a low definition pixel and a high definition pixel in a unit area M, and is a transparent display. Besides, the arrangement of the low definition pixels on the left side of FIG. 13 is the same as that of the low definition pixels of FIG. 6 according to the second embodiment, and the transparent pixel (transparent opening) TP, and the G pixel and the W pixel as the high definition pixels are arranged around the low definition pixel.

The right side of FIG. 13 is a view showing a pixel layout of a display area DP of modified example 1 of the organic EL display device 1 of the fifth embodiment. As shown in the drawing, in the modified example 1, the transparent pixel TP is further arranged instead of the W pixel, and the transparency of the display is further improved.

Besides, since the W pixel is not arranged in the modified example 1, coloring is performed more preferably by separately painting the organic layer OL in RGB than by arranging the color filter layer CF on the opposite substrate B2.

Figure 14:
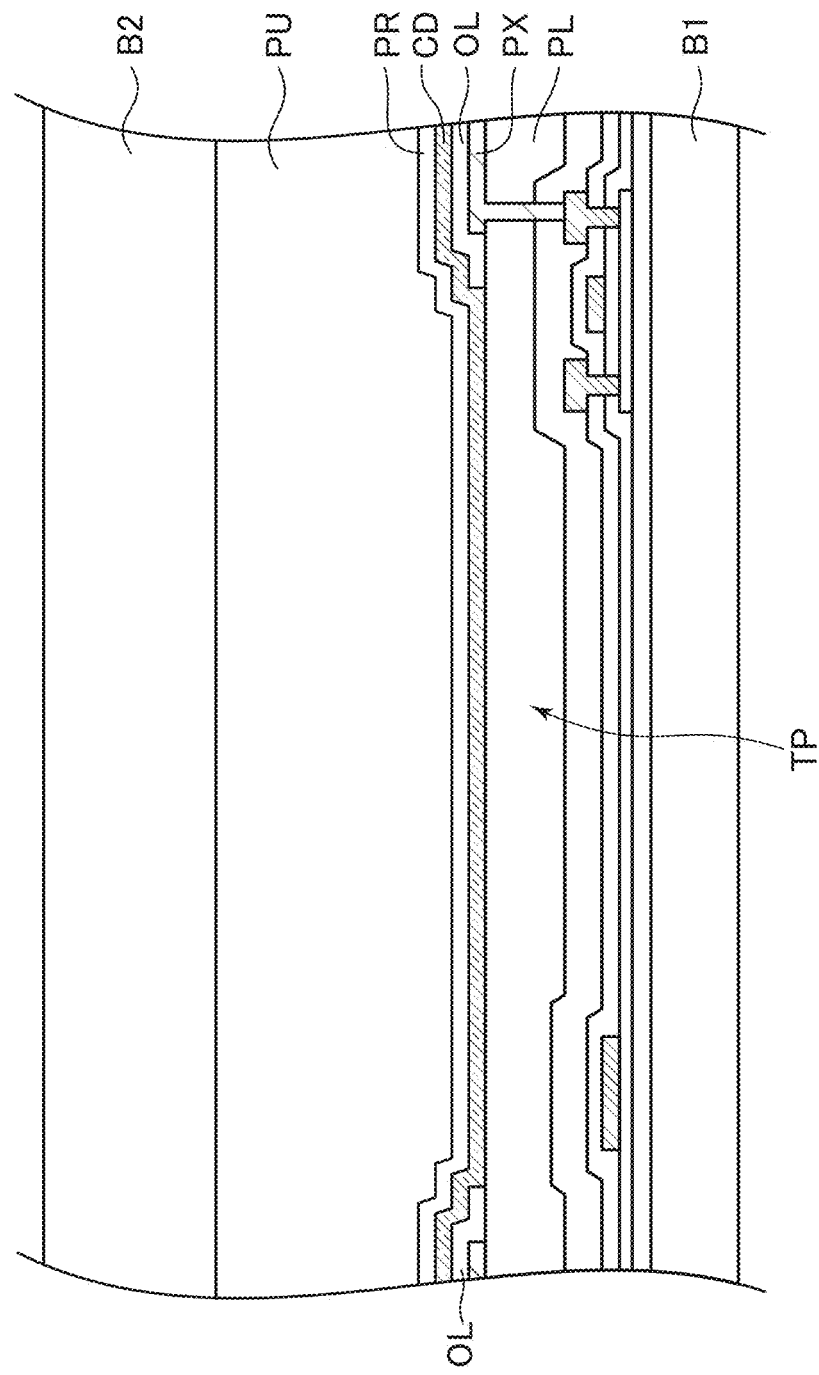
FIG. 14 is a view showing a section of a transparent pixel of the display device of the modified example 1 of the fifth embodiment.

FIG. 14 is a view showing an example of a section of the transparent pixel TP of the modified example 1 in which coloring is performed by separately painting the organic layer OL. The organic layer OL, a lower electrode PX and the like do not exist in the transparent pixel TP, and light passes through to the outside of an opposite substrate B2 from an element substrate B1 side, and the transparent display is realized by this.

Incidentally, in the case of the modified example 1 in which coloring is performed by separately painting the organic layer OL, as shown in FIG. 14, a black matrix BM may not be formed on the opposite substrate B2. A light-emitting layer of the organic layer OL is shaped to be separately painted for each pixel. Besides, part of the organic layer OL (specifically, an electron injection layer, an electron transport layer, a hole transport layer and a hole injection layer) may be formed to be common to the transparent pixel TP and the other pixels. Besides, although the bank layer BK and the organic layer OL are not formed in FIG. 14, these may exist also in the transparent pixel TP, and may be formed so that the organic layer OL is divided by the bank layer BK in each pixel. Besides, in the transparent pixel TP, it is desirable for improvement in transmittance that the bank layer BK and the organic layer OL do not exist. Besides, for improvement in transmittance, a gate insulating film of a thin film transistor connected to a lower electrode PX in another pixel may be removed in the transparent pixel TP.

Incidentally, in the pixel arrangement of the display area DP of the respective embodiments, the transparent pixel TP may be arranged instead of the W pixel, or part of the W pixels may be replaced by the transparent pixels TP. Specifically, all the W pixels in FIGS. 3 to 8 and 10 to 12 may be replaced by the transparent pixels TP, or part of the W pixels may be replaced by the transparent pixels TP.

Figure 15:
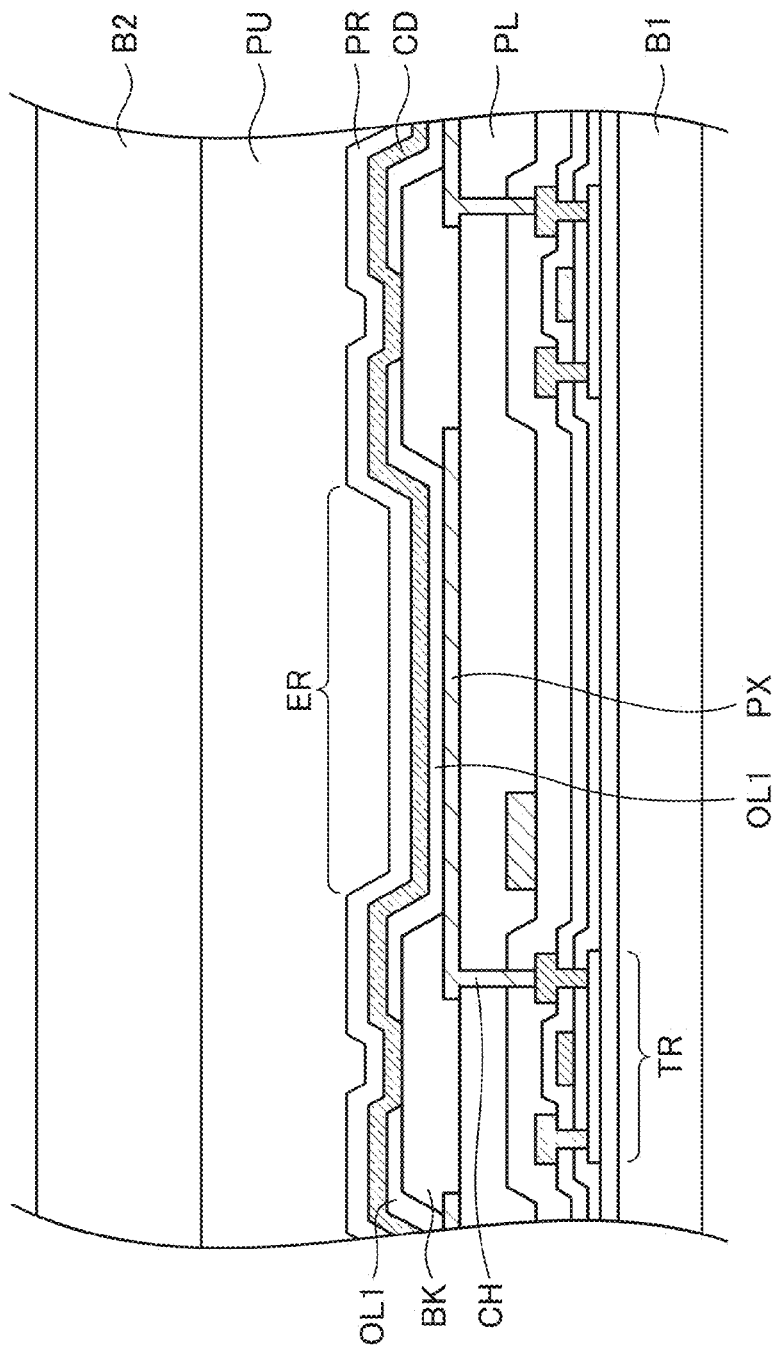
FIG. 15 shows an example of a sectional schematic view of a pixel area in the display device of a separately coloring system of the modified example 1 of the fifth embodiment.

FIG. 15 shows an example of a sectional schematic view of a pixel area in an organic EL display device of an RGB separate coloring mode.

A color filter CF and a black matrix BM do not exist on an opposite substrate B2, and an organic layer OL1 is divided on a bank layer BK. (Material of the organic layer OL1 varies for each color pixel with respect to a light-emitting layer, and is common to an electron injection layer, an electron transport layer, a hole transport layer and a hole injection layer. In FIG. 15, the electron injection layer and the like are omitted, and the organic layer OL1 is divided on the bank layer BK.) Further, a W pixel does not exist in the organic EL display device of this mode, but R pixels, G pixels and B pixels exist. Y pixels, Cy pixels and Mg pixels may also exist.

The mode of FIG. 15 can be applied to display devices in which all the W pixels in FIGS. 3 to 8 and 10 to 12 are replaced by the transparent pixels TP. Further, the mode can be applied to the right side of FIG. 13. The transparent display can be formed in this way, and the transmittance thereof is proportional to the area density of the transparent pixel TP.

In this case, in order to increase the transmittance, the opening of the transparent pixel TP is larger than that of at least the G pixel, and is preferably equal to or larger than that of the B pixel and the R pixel.

Since the separately coloring system is adopted as in FIG. 15, light quantity is not reduced by a color filter. Thus, low power consumption processing by the W pixel is unnecessary in principle. Further, since the W pixel does not exist, the place of the W pixel can be replaced by a light translucent part, and the transmittance of the transparent display can be increased. Image processing required by the insertion of the W pixel also becomes unnecessary. Thus, the development cost is reduced, power consumption increase due to the image processing does not occur, and a circuit for the image processing and an program storage area become unnecessary. The organic layer OL1 of the W pixel is not naturally required to be formed. Incidentally, the electron injection layer, the electron transport layer, the hole transport layer and the hole injection layer may be separated by the bank layer BK in each color in order to prevent electric color mixture. Alternatively, the electron injection layer, the electron transport layer, the hole transport layer and the hole injection layer may be made common to the respective pixels, and only the light-emitting layer in the organic layer OL1 may be separated by the bank in the respective pixels. Besides, although the black matrix is also removed, the black matrix may be provided on the opposite substrate B2 just above the bank layer BK in order to prevent optical color mixture. As a separately coloring method, a mask may be used to perform separately coloring, or a printing system such as ink jet may be used to perform separately coloring.

Incidentally, in FIG. 15, a black matrix does not exist. Thus, a light-emitting area ER corresponds to an opening of each pixel. The light-emitting area ER is an area where a lower electrode PX, an organic layer OL1 and an upper electrode CD contact each other, and is an area where light is emitted when current flows through these components.

Besides, the transmittance from the back side to the front side of the transparent display of the fifth embodiment is proportional to the area density of the transparent pixel TP in the display area DP. If the black matrix BM is formed on the opposite substrate B2, the opening area of the transparent pixel TP by the black matrix BM is preferably made larger than the opening area of the high definition pixel (G pixel), and is further desirably made equal to or larger than the opening area of the low definition pixel (R pixel and B pixel). Besides, if the black matrix BM is not formed on the opposite substrate B2, the opening area of the transparent pixel TP partitioned by a wiring such as a first scanning line BG or a video signal line Data is preferably made larger than the light-emitting area of the G pixel by the organic layer OL, and is further desirably made equal to or larger than the light-emitting area of the R pixel and the B pixel by the organic layer OL.

Although the organic EL display device 1 of the fifth embodiment is described in the above, the description is made mainly on the different points from the organic EL display device 1 of the first embodiment, and the description of almost the same point as that of the case of the first embodiment is suitably omitted.

FIG. 16 shows a relation between a unit area M as a main pixel and an image address. Hereinafter, sub-pixels arranged in the unit area M as the main pixel in the respective embodiments will be described by using FIG. 16.

P(x,y) represents an image address of an arbitrary place. As shown in FIG. 16, the image address is sequentially scanned from left to right at the first row in one frame, and the organic EL display device 1 is driven in accordance with the read display data. Next, the image address is scanned from left to right at the second row, and scan is sequentially performed at a lower raw, and finally, P(m,n) is scanned. The organic EL display device 1 is driven in accordance with the read display data. Here, m, n, x and y are respectively natural numbers.

An area of the organic EL display device 1 corresponding to each P(x,y) is the unit area M. With respect to data stored at P(x,y) corresponding to the unit area M, the same pixel data is stored for each color, data are different for different colors. For example, when two R pixels, two B pixels, three R pixels and one W pixel are included in the unit area M, the same data read from P(x,y) are used for the two R pixels in the unit pixel M, the same data read from P(x,y) are used for the two B pixels, the same data read from P(x,y) are used for the three G pixels, and the same data read from P(x,y) are used for the one W pixel. With respect to each of the R pixel, the B pixel, the G pixel and the W pixel, different data of storage areas corresponding to different P(x,y) are used.

Incidentally, although the display device of the respective embodiments is the organic EL display device 1, the invention is not limited to this. For example, the display device may be a self light-emitting display device in which each pixel of the display area DP includes a self light-emitting element such as a quantum-dot light emitting diode (QLED), or a liquid crystal display device. Besides, the display device may be a bottom emission type self light-emitting display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    low definition pixels as sub-pixels, each of the low definition pixels having an area larger than a specified standard area;
    high definition pixels as sub-pixels, each of the high definition pixels having an area smaller than the specified standard area; and
    transparent pixels larger than the low definition pixels, wherein
    the low definition pixels, the high definition pixels, and the transparent pixels are included in each of unit areas which are regularly arranged,
    the low definition pixels include blue pixels and red pixels,
    the high definition pixels include green pixels,
    each of the red, green, and blue pixels includes an organic light emitting element and a transistor connected to the organic light emitting element,
    none of the transparent pixels includes any organic light emitting element or any transistor,
    none of the red, green, and blue pixels overlaps with any of the transparent pixels, and
    none of the transparent pixels is configured to be controlled by any switch element in each of the transparent pixels.

2. The display device according to claim 1, further comprising:
    an element substrate on which the organic light emitting element and the transistor is formed; and
    an opposite substrate facing the element substrate,
    wherein the transparent pixels each are configured to transmit light coming into the element substrate and going outside of the opposite substrate.

3. A display device comprising:
    a plurality of first pixels each of which includes a red pixel or a blue pixel and has a first area;
    a plurality of second pixels each of which includes a green pixel and has a second area; and
    a plurality of third pixels each of which includes a transparent pixel and has a third area,
    wherein
    the first area is larger than the second area,
    the third area is larger than the first area,
    each of the plurality of first and second pixels includes an organic light emitting element and a transistor connected to the organic light emitting element,
    none of the plurality of third pixels includes any organic light emitting element or any transistor,
    none of the plurality of first and second pixels overlaps with any of the plurality of third pixels,
    the plurality of first and second pixels are arranged in a matrix in plan view along two orthogonal axes, the two orthogonal axes extending in a first direction, in a second direction perpendicular to the first direction, in a third direction opposite to the first direction, and in a fourth direction opposite to the second direction,
    each of the plurality of first pixels is adjacent to respective ones of the plurality of third pixels in the first direction, the second direction, the third direction, and the fourth direction in plan view, and
    each of the plurality of second pixels is adjacent to respective ones of the plurality of third pixels in the first direction, the second direction, the third direction, and the fourth direction in plan view.

4. The display device according to claim 3, further comprising:
    an element substrate on which the organic light emitting element and the transistor is formed; and
    an opposite substrate facing the element substrate,
    wherein the transparent pixel is configured to transmit light coming into the element substrate and going outside of the opposite substrate.

5. The display device according to claim 3, wherein the plurality of second pixels are provided in more number than each of the red pixel and the blue pixel.

6. The display device according to claim 3, further comprising:
    an element substrate on which the organic light emitting element and the transistor is formed; and an opposite substrate facing the element substrate,
wherein
the element substrate has a first side, a second side, a third side, and a fourth side in plan view,
the first side runs along a fifth direction, the second side runs along a sixth direction, the third side runs along a seventh direction, the fourth side runs along an eighth direction, the sixth direction is perpendicular to the fifth direction, the seventh direction is an opposite direction to the fifth direction, the eighth direction is an opposite direction to the sixth direction, and each of the fifth and seventh directions is perpendicular to each of the sixth and eighth directions, and
each of the fifth, sixth, seventh, and eighth directions differs from each of first, second, third, and fourth directions.

7. The display device according to claim 3, wherein
a central portion of each of the plurality of first pixels is adjacent to respective ones of the plurality of third pixels in the first direction, the second direction, a third direction, and a fourth direction in plan view, and
a central portion of each of the plurality of second pixels is adjacent to respective ones of the plurality of third pixels in the first direction, the second direction, a third direction, and a fourth direction in plan view.

* * * * *